United States Patent
Suarez

(10) Patent No.: US 9,613,178 B2
(45) Date of Patent: Apr. 4, 2017

(54) INTEGRATED CIRCUIT TOPOLOGIES FOR DISCRETE CIRCUITS

(71) Applicant: The Government of the United States, as represented by the Secretary of the Army, Washington, DC (US)

(72) Inventor: John Suarez, Brooklyn, NY (US)

(73) Assignee: The United States of America, as represented by the Secretary of the Army, Washington, DC (US)

( * ) Notice: Subject to any disclaimer, the term of this patent is extended or adjusted under 35 U.S.C. 154(b) by 85 days.

(21) Appl. No.: 14/595,599

(22) Filed: Jan. 13, 2015

(65) Prior Publication Data
US 2016/0203255 A1  Jul. 14, 2016

(51) Int. Cl.
*G06F 17/50* (2006.01)
*G01R 31/317* (2006.01)

(52) U.S. Cl.
CPC ....... *G06F 17/5081* (2013.01); *G01R 31/317* (2013.01); *G06F 17/5063* (2013.01)

(58) Field of Classification Search
CPC .................................................. G06F 17/5081
USPC ........................................................ 716/136
See application file for complete search history.

(56) References Cited

U.S. PATENT DOCUMENTS

| | | | |
|---|---|---|---|
| 4,306,113 A * | 12/1981 | Morton | H03G 5/165 333/28 T |
| 4,641,105 A * | 2/1987 | Albaugh et al. | H03F 3/45968 330/260 |
| 4,839,573 A * | 6/1989 | Wise | G05B 13/0245 318/611 |
| 4,939,478 A * | 7/1990 | Heimsch et al. | H03K 19/09448 326/66 |
| 5,376,937 A | 12/1994 | Colleran et al. | |
| 5,550,492 A | 8/1996 | Murden | |
| 5,554,943 A | 9/1996 | Moreland | |
| 5,757,234 A | 5/1998 | Lane | |
| 5,838,184 A | 11/1998 | Tomiyama | |
| 5,859,569 A | 1/1999 | Le et al. | |
| 6,081,151 A | 6/2000 | Boulic | |
| 6,246,937 B1 * | 6/2001 | Miyaguchi et al. | B60R 21/013 280/735 |

(Continued)

OTHER PUBLICATIONS

Sedra and Smith, Microelectronic Circuits, fourth edition, Jun. 1997, pp. 487-492, 527-533, A4-A10, Oxford University Press, New York City, NY 10016 USA.

(Continued)

*Primary Examiner* — Sun Lin
(74) *Attorney, Agent, or Firm* — Ronald Krosky; Azza Jayaprakash

(57) ABSTRACT

Various embodiments that pertain to electronic element matching are described. Having electronic elements, such as transistors, matching can be relatively easy in an integrated circuit environment. Transitioning to a discrete circuit environment, finding electronics elements that match one another can be more challenging. If the electronic elements themselves do not match, then their outputs will not match. To compensate for these mismatches, when one wants the outputs to be matched, an output of one of the electronic elements can be modified so that the outputs are matched. Therefore, a discrete circuit can be produced that functions similarly to that of an integrated circuit.

20 Claims, 8 Drawing Sheets

(56) References Cited

U.S. PATENT DOCUMENTS

| | | |
|---|---|---|
| 6,369,652 B1 * | 4/2002 | Nguyen et al. ..... H03F 3/45183 330/253 |
| 6,373,147 B1 * | 4/2002 | Miyaguchi et al. ......... 307/10.1 |
| 6,445,791 B1 | 9/2002 | Grisamore et al. |
| 6,513,383 B1 * | 2/2003 | Okano et al. ......... B60R 21/013 73/514.34 |
| 6,642,768 B1 | 11/2003 | Schell et al. |
| 6,809,678 B2 * | 10/2004 | Vera et al. .............. H02J 1/102 323/299 |
| 6,958,593 B2 * | 10/2005 | Asanuma et al. ........ G05F 1/46 323/282 |
| 7,443,915 B2 | 10/2008 | Standish et al. |
| 7,741,981 B1 | 6/2010 | Wan et al. |
| 8,212,616 B2 | 7/2012 | Ohannaidh |
| 8,248,288 B2 | 8/2012 | Ren et al. |
| 8,767,106 B2 | 7/2014 | Ueno |
| 2008/0074192 A1 | 3/2008 | Mizuno |
| 2011/0069516 A1 | 3/2011 | Greene et al. |
| 2011/0316636 A1 | 12/2011 | Zhao et al. |
| 2013/0076551 A1 | 3/2013 | Marukame et al. |
| 2014/0176243 A1 | 6/2014 | Trainor et al. |

OTHER PUBLICATIONS

MICROSEMI, 2N2222A, Datasheet# MSC0275A, May 19, 1997.

* cited by examiner ical circuit designer can want to create a circuit
INTEGRATED CIRCUIT TOPOLOGIES FOR DISCRETE CIRCUITS

GOVERNMENT INTEREST

The innovation described herein may be manufactured, used, imported, sold, and licensed by or for the Government of the United States of America without the payment of any royalty thereon or therefor.

BACKGROUND

An electrical circuit designer can want to create a circuit with elements that have matching physical characteristics. The designer can select to use an integrated circuit to produce the circuit with elements that have matching physical characteristics. This matching can occur with relative ease because in the integrated circuit the elements share a substrate. However, if the designer wants to use a discrete circuit as opposed to the integrated circuit, then the substrate is not available for the matching and this can make matching more difficult.

SUMMARY

In one embodiment, a system comprises a determination component and a compensation component. The determination component can be configured to make a determination that an output of a first discrete electronic element that is part of a circuit and an output of a second discrete electronic element that is part of the circuit do not match. The compensation component can be configured to perform a compensation upon the circuit such that the output of the first discrete electronic element and the output of the second discrete electronic element match. The determination component, the compensation component, or a combination thereof is implemented, at least in part, by way of non-software.

In one embodiment, a method is performed by a circuit management apparatus. The method comprises obtaining a first voltage change from across a first measurement resistor, where the first measurement resistor is associated with a first transistor. The method also comprises calculating a current through the first measurement resistor by use of the first voltage change. The method further comprises obtaining a second voltage change from across a second measurement resistor, where the second measurement resistor is associated with a second transistor. In addition, the method comprises calculating a current through the second measurement resistor by use of the second voltage change. Further, the method comprises determining if a difference that is undesired exists between the current through the first measurement resistor and the current through the second measurement resistor. The method additionally comprises computing a value for a discrete compensation resistor when it is determined that the difference does exist, where the value is based, at least in part, on the difference between the current through the first measurement resistor and the current through the second measurement resistor. The method also comprises setting the discrete compensation resistor to implement with the value such that the current of the first transistor and the current of the second transistor match, where the discrete compensation resistor is associated with the second transistor.

In one embodiment, a system comprises a differential pair comprising a first discrete transistor and a second discrete transistor, where the current of the first discrete transistor does not match with a current of the second discrete transistor. The system also comprises a first discrete measurement hardware component that is physically coupled to the first discrete transistor and that produces an information set of the current of the first discrete transistor and a second discrete measurement hardware component that is physically coupled to the second discrete transistor and that produces an information set of the current of the second discrete transistor. Additionally, the system comprises a discrete compensation resistor that is physically coupled to the second discrete transistor and that performs a modification to the current of the second discrete transistor to produce a modified current of the second discrete transistor where the current of the first discrete transistor and the modified current of the second transistor match. The modification can be based, at least in part, on the information set of the current of the first discrete transistor and the information set of the current of the second discrete transistor.

BRIEF DESCRIPTION OF THE DRAWINGS

Incorporated herein are drawings that constitute a part of the specification and illustrate embodiments of the detailed description. The detailed description will now be described further with reference to the accompanying drawings as follows.

DETAILED DESCRIPTION

Figure 1:
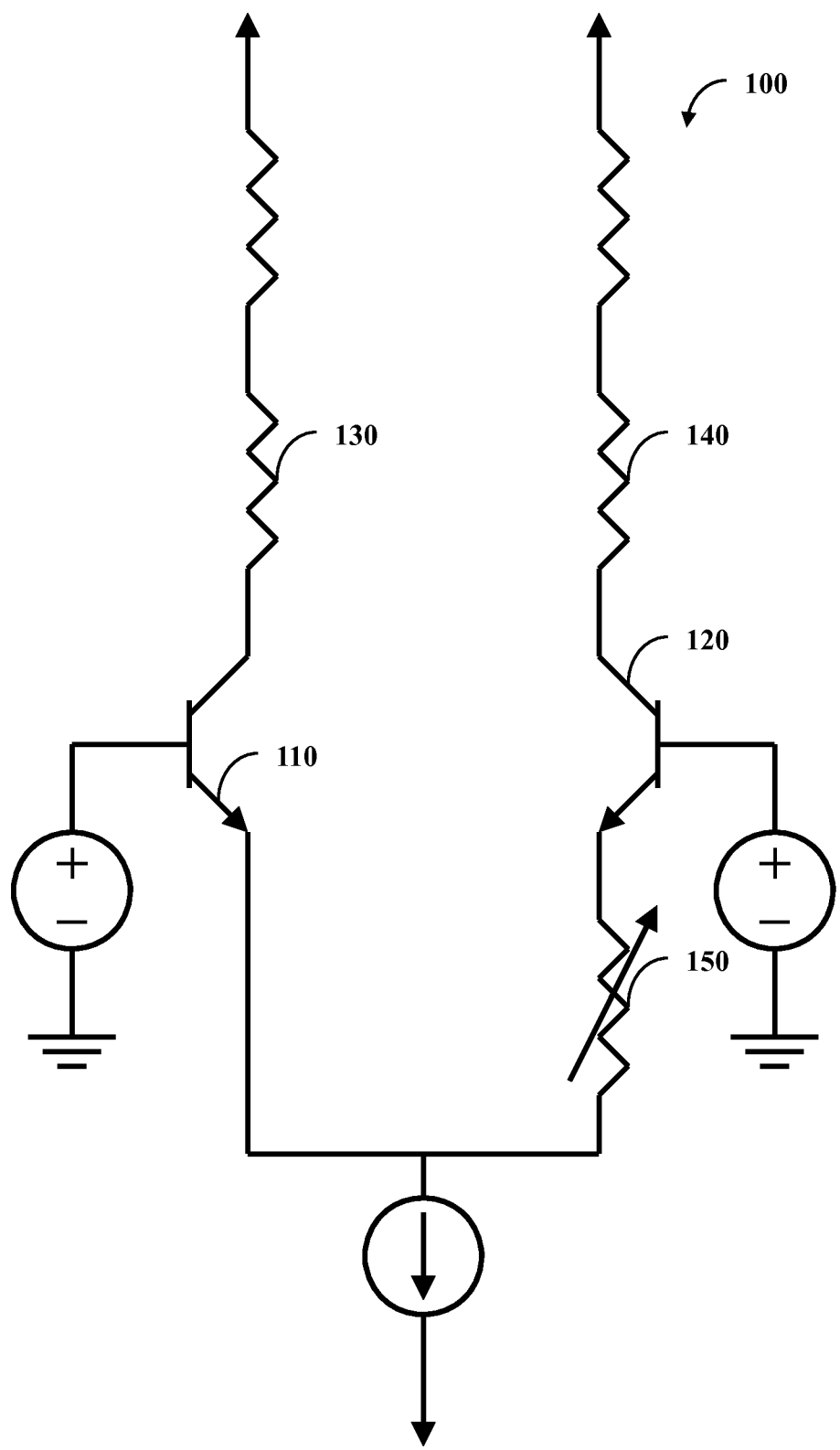
FIG. 1 illustrates one embodiment of a system comprising a first transistor, a second transistor, a first measurement resistor, a second measurement resistor, and a compensation resistor.

When creating a circuit with discrete components, it can be difficult to find discrete elements that actually match (e.g., elements that have the same cross-sectional area and/or have the same doping profile). Even if two transistors have the same part number, the β-value (common-emitter current gain) of the two transistors can vary widely between them. Transistors can be similar, but a difference of one micrometer from one transistor to another can produce results such that the transistors are not matched. Further, even if two discrete transistors do physically match, the transistors may have different temperatures in operation and therefore still not fully match. Having the temperature of these transistors match while current is in operation can be important since electrical characteristics can vary with temperature. Since discrete transistors do not share a substrate, the chances of their temperature matching are extremely small. If the temperatures do not match, then the discrete transistors themselves do not match and in turn their outputs do not match.

With practice of aspects disclosed herein a discrete circuit can function similarly to an integrated circuit. This similar functioning can include functioning as if there is temperature and physical matching of electronic element characteristics. Since the discrete circuit does not have the substrate of the integrated circuit, the discrete circuit can cause physical matching of elements, such as transistors, through a feedback system. Voltage and/or current can be measured for a first transistor and a second transistor that are part of the discrete circuit, such as part of a differential pair. If the voltages or currents of the transistors do not match, then a resistor associated with one of the transistors can have its value modified. The modification of this value can cause the output of the transistors to match. Therefore, the discrete circuit can emulate an integrated circuit.

Aspects disclosed herein can be practiced at least in the fields of circuit design, analog electronics, and electronic instrumentation. In one example, aspects disclosed herein can be used in making a prototype of a circuit with discrete elements. Having a manufacturer make a prototype of an integrated circuit can be cost prohibitive. Therefore, it can be advantageous to make a prototype with a discrete circuit since it can be cheaper. With this, the prototype can be for a circuit intended to be manufactured as an integrated circuit.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action(s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components. The term 'component' and the term 'module' can be used interchangeably to have the same meaning.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs including separate applications or code from dynamically linked libraries.

FIG. 1 illustrates one embodiment of a system 100 comprising a first transistor 110, a second transistor 120, a first measurement resistor 130, a second measurement resistor 140, and a compensation resistor 150. The transistors 110-120 and the resistors 130-150 can be discrete circuit elements. The first transistor 110 and the second transistor 120 can form a differential pair. The first measurement resistor 130 can be physically coupled to the first transistor 110 and can produce an information set of the current of the first transistor 110. Likewise, the second measurement resistor 140 can be physically coupled to the second transistor 120 and can produce an information set of the current of the second transistor 120. The information offset indicates a voltage drop across a respective resistor. With this voltage drop and a value of the resistors 130 and 140 known (e.g., the resistors 130 and 140 are of about equal value), the currents for the first transistor 110 and the second transistor 120 can be calculated through Ohm's law (I=V/R).

In one embodiment, as opposed to using the first measurement resistor 130 and/or the second measurement resistor 140, non-invasive current sensors can be used. These current sensors could measure the current directly as opposed to measuring voltage across a resistor. The resistors 130 and 140 as well as the current sensors can be examples of measurement hardware components. Whether resistors 130 and 140 are used or current sensors, the same approach can be applied.

If the currents are equal for both transistors 110 and 120, then the compensation resistor 150 has a value of about zero (compensation is not performed). However, if the current of the first transistor 110 does not match with a current of the second transistor 120, then the compensation resistor 150 can operate. The compensation resistor 150 can be physically coupled to the second transistor 120 and can perform a modification to the current of the second transistor 120. This modification can change the current of the second transistor 120 into a modified current of the second transistor that matches the current of the first transistor 110. The modification can be based, at least in part, on the information set of the current of the first transistor 110 and the information set of the current of the second transistor 120.

While the system 100 is illustrated with one compensation resistor 150, it is to be appreciated by one of ordinary skill in the art that more than one compensation resistor 150 can be used. In one example, in addition to the compensation resistor 150 being physically coupled to the second transistor 120 a second compensation resistor can be physically coupled to the first transistor 110 in an equivalent location to that of the compensation resistor 150. This way, if the current is higher for the first transistor 110 than the second transistor 120, then appropriate compensation can occur so currents match.

While the system 100 addresses transistors 110 and 120, it is to be appreciated by one of ordinary skill in the art that other electronic elements can be used and thus be matched. In one example, two diodes can be matched through aspects disclosed herein. Further, while the system 100 illustrates matching of two electronic elements, more than two electronic elements can be matched together if desired. In one example, the matched elements can be medal-oxide field-effect transistors (MOSFETs) or bipolar junction transistors (BJTs).

In one example with the transistors 110 and 120 being BJTs, their emitters can be tied together and the bases of the BJTs can comprise input of the differential pair while collectors of the BJTs can comprise the output of the differential pair. The goal can be for the system 100, as a circuit, to produce an about zero output voltage when input voltage to the bases is about equal. With this, the differential pair responds to voltage differences while rejecting identical voltage signals.

Figure 2:
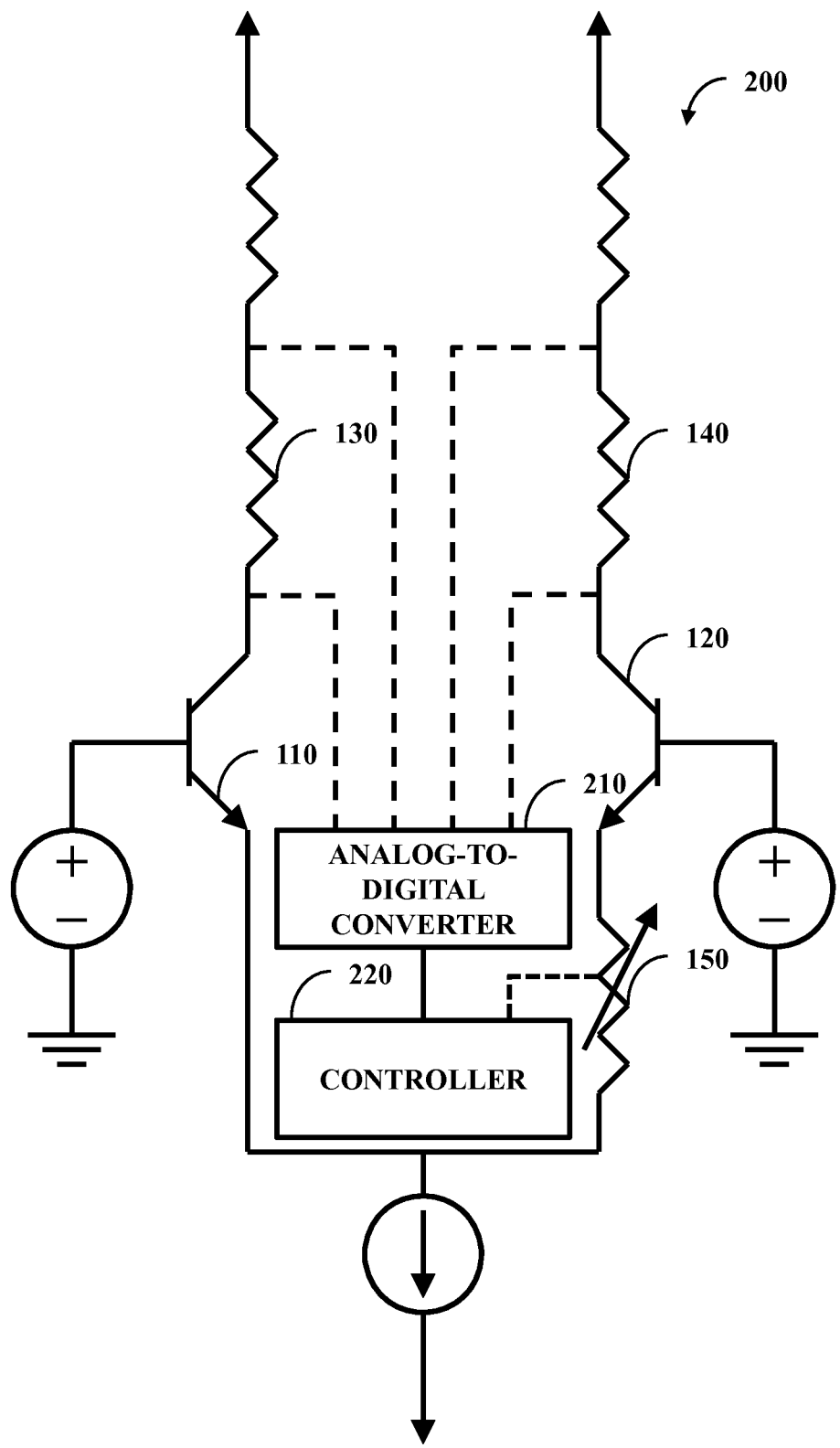
FIG. 2 illustrates one embodiment of a system comprising the first transistor, the second discrete transistor, the first measurement resistor, the second measurement resistor, the compensation resistor, an analog-to-digital converter, and a controller.

FIG. 2 illustrates one embodiment of a system 200 comprising the first transistor 110, the second discrete transistor 120, the first measurement resistor 130, the second measurement resistor 140, the compensation resistor 150, an analog-to-digital converter 210, and a controller 220. The analog-to-digital converter 210 can measure the information set of the current of the first transistor 110 and measure the information set of the current of the second transistor 120. The controller 220 can make a determination of the value of the compensation resistor 150 through use of the information set of the current of the first transistor 110 and the information set of the current of the second transistor 120. While shown as two distinct items, the analog-to-digital converter 210 and the controller 220 can function as a single physical item. The controller 220 can set the value of the compensation resistor 150 in accordance with the determination.

Figure 3:
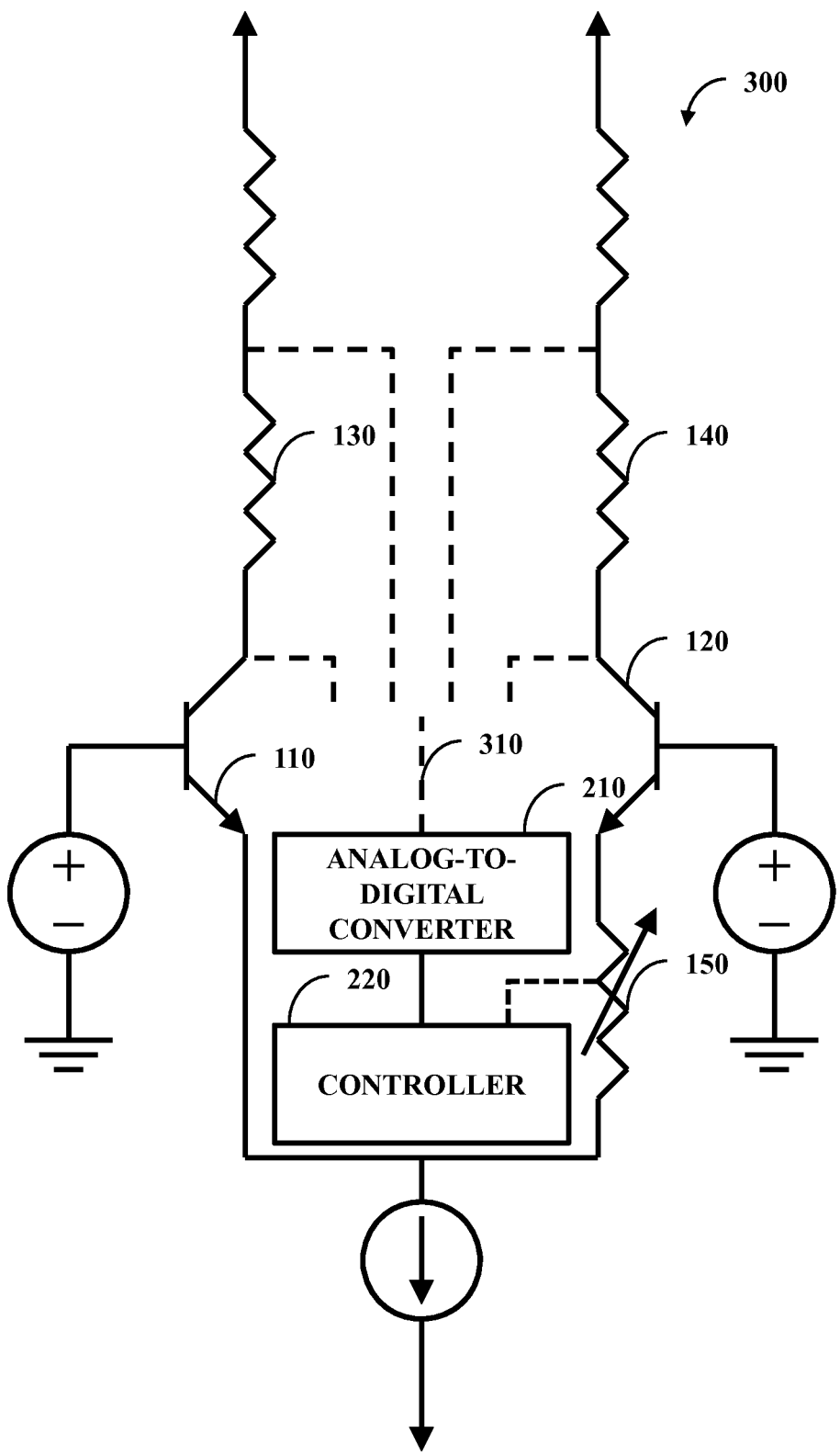
FIG. 3 illustrates one embodiment of a system comprising the first transistor, the second discrete transistor, the first measurement resistor, the second measurement resistor, the compensation resistor, an analog-to-digital converter, a controller, and an input switch.

FIG. 3 illustrates one embodiment of a system 300 comprising the first transistor 110, the second discrete transistor 120, the first measurement resistor 130, the second measurement resistor 140, the compensation resistor 150, an analog-to-digital converter 210, a controller 220, and an input switch 310. The input switch 310 can move among a first position aligned with an end of the first measurement resistor 130, a second position aligned with an opposite end of the first measurement resistor 130, a third position aligned with an end of the second measurement resistor 140, and a fourth position aligned with an opposite end of the second measurement resistor 140. The analog-to-digital converter 210 can obtain a voltage when the input switch is at the first position, the second position, the third position, and the fourth position. These voltages can be available to the controller 220. The controller 220 can use a difference between the voltage when the input switch 310 is at the first position and the voltage when the input switch 310 is at the second position in making the determination of the value of the compensation resistor 150. With this, the controller 220 can measure the voltage drop across the measurement resistor 130. Similarly, the controller can use a difference between the voltage when the input switch 310 is at the third position and the voltage when the input switch 310 is at the fourth position in making the determination.

With these differences, the controller 220 can determine if the outputs for the transistors 110 and 120 match. If values of the resistors 130 and 140 are about the same and the voltage drops are different, then the controller 220 can identify that the currents are different. Based on this difference, the controller 220 can calculate the value of the compensation resistor 150 to have the currents match and cause the compensation resistor 150 to implement with the value.

In one example, the resistors 130 and 140 can have about the same value, such as about 1 Ohm ($\Omega$). The voltage drop across the first measurement resistor 130 can be 1 Volts (V) while the voltage drop across the second measurement resistor 140 can be 2V. Therefore, the current can calculated as 1 Amp (A) for the transistor 110 due to current equaling 1V/1$\Omega$ and 2 A for the transistor 120 due to current equaling 2V/1$\Omega$. The compensation resistor 150 can be set at 1$\Omega$ such that the total resistance for the combination of resistors 140 and 150 is 2$\Omega$ and this can cause the output currents to match at 1 A.

After the controller 220 sets the value of the compensation resistor 150, the analog-to-digital converter 210, the input switch 310, and the controller 220 can continue to perform their respective functionality. Multiple changes can occur in the system 300 (or, for example, the system 100 of FIG. 1). In one example, over time, the transistors 110 and 120 can experience changes such that currents start to differ over time. In another example, voltage provided by the voltage sources can change (e.g. by technician instruction). The input switch 310 can continuously cycle among the four positions and the analog-to-digital converter 210 and controller 220 can work to update the compensation resistor 150 so that the currents continue to match when a change occurs.

Figure 4:
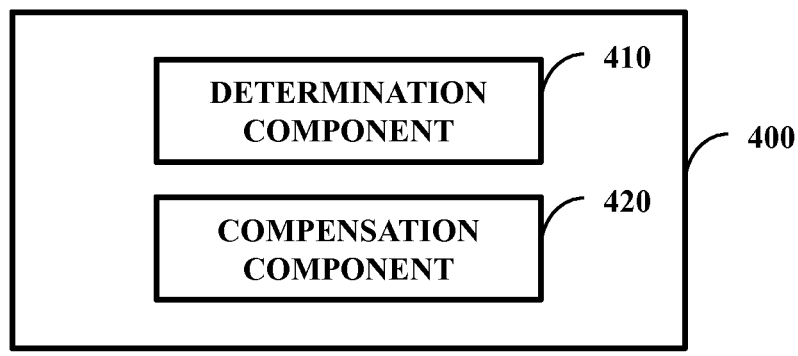
FIG. 4 illustrates one embodiment of a system comprising a determination component and a compensation component.

FIG. 4 illustrates one embodiment of a system 400 comprising a determination component 410 and a compensation component 420. The determination component 410 can be configured to make a determination that an output of a first discrete electronic element (e.g., the first transistor 110 of FIG. 1 or a diode) that is part of a circuit does not match an output of a second discrete electronic element (e.g., the second transistor 120 of FIG. 1) that is part of the circuit. In one example, the output can be a current of the respective electronic element or can be a voltage of the respective electronic element.

The compensation component 420 can be configured to perform a compensation upon the circuit such that the output of the first discrete electronic element and the output of the second discrete electronic element match. This compensation can be performed in different manners. In one embodiment, the compensation component 420 performs the compensation through adjustment of a bias of at least one of the first discrete electronic element or the second discrete electronic element. In this embodiment, this adjustment can comprise adjusting a direct current voltage or current for the discrete electronic element. The compensation component 420 can comprise logic to determine what electronic element bias to modify, how modification should occur and to what degree, or if adjustment of the bias should be the modification type.

In one embodiment, the compensation component 420 performs the compensation through adjustment of a value of a variable resistor (e.g., the compensation resistor 150 of FIG. 1) associated with the first discrete electronic element. The compensation component 420 can be configured to select the value of the variable resistor based, at least in part, on the output of the first discrete electronic element and the output of the second discrete electronic element. The variable resistor can modify at least one of the output of the first discrete electronic element or the output of the second discrete electronic element. The compensation component 420 can compare the output of the first discrete electronic element against the output of the second discrete electronic element to create a comparison result. The compensation component 420 can determine if there is a difference between the output of the first discrete electronic element and the output of the second discrete electronic element. If there is no difference, then the outputs match and the value of the variable resistor can be unchanged. Conversely, if there is a difference, then the outputs do not match and setting or changing the value may be appropriate. When there is a difference the compensation component 420 can select and implement the value.

While discussion herein relates to a difference between the outputs, an actual implementation may be used that distinguishes between a desired difference and an undesired difference. Using the system 100 of FIG. 1 as an example circuit in this paragraph, the transistors 110 and 120 should be matched so that the circuit as a whole responds to voltages. A circuit designer should be careful so that the circuit fails to respond to any external voltage. To put another way, the compensation resistor 150 should not be configured to compensate for every difference, just differences from arising from physical differences of the transistors 110 and 120 themselves (an undesired difference) as opposed to a signal-input difference (a desired difference). To achieve this, a circuit designer can design a system in accordance with aspects disclosed herein such that the system can distinguish between a desired difference and an undesired difference.

Distinguishing between a desired difference and an undesired difference can be performed by the compensation component 420. The compensation component 420 can determine if the difference is a desired difference or is not desired. The compensation component 420 can select the value, and in turn cause the variable resistor to implement with the value, when the difference is not desired and when the difference is desired the variable resistor can remain unchanged.

The compensation component 420 can determine if the difference is desirable in various manners depending on circuit design. In one embodiment, the desired difference is that the difference meets a set threshold (e.g., exceeds the set threshold or reaches the set threshold). This can be used such that a difference, such as a current difference, is neglected when above a certain amount. The compensation component 420 can determine if the difference is desired or not depending on if the difference is constant or if the difference is time-varying. If the difference is non-constant, such as being time varying, then the difference can be classified as desired, while a constant difference can be considered as undesired and therefore be subject to correction with the variable resistor. The compensation component 420 can be configured to not function, such as by being disabled, when an input signal is applied to the circuit. Once the input signal is no longer applied, the compensation component 420 can continue to operate.

The determination component 410 and the compensation component 420 can function continuously. Once the compensation component 420 performs the compensation, the determination component 410 can continuously determine if the outputs continue to match or not. This lack of matching can occur with physical changes to the electronic elements over time. If a lack of matching is determined subsequent to the compensation, then the compensation component 420 can perform another compensation to cause the outputs to match.

Figure 5:
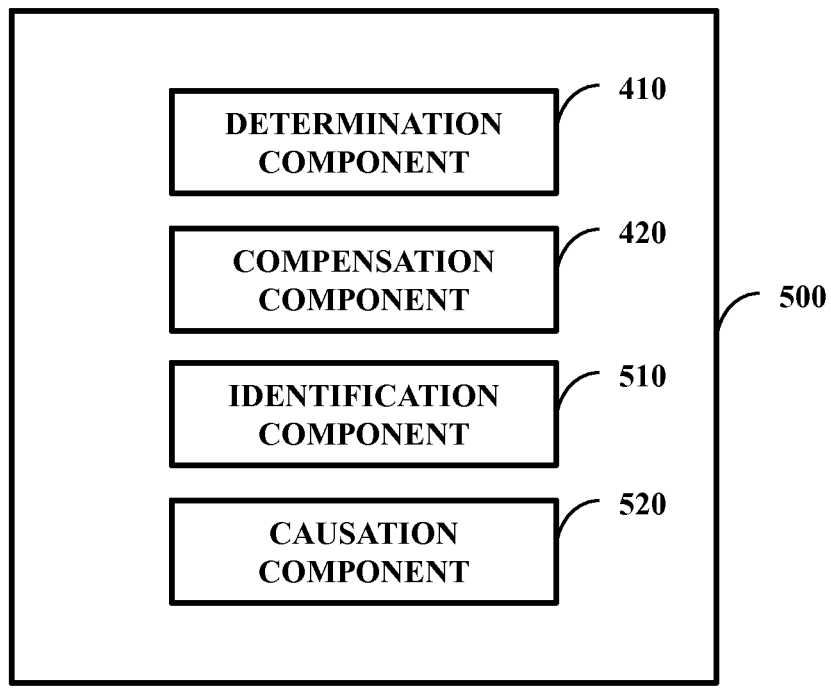
FIG. 5 illustrates one embodiment of a system comprising the determination component, the compensation component, an identification component, and a causation component.

FIG. 5 illustrates one embodiment of a system 500 comprising the determination component 410, the compensation component 420, an identification component 510, and a causation component 520. The identification component 510 can be configured to identify a situation where mismatch of the output of the first discrete electronic element and the output of the second discrete electronic element is appropriate. The causation component 520 can be configured to prevent the compensation component 420 from performance of the compensation when the situation is identified.

Figure 6:
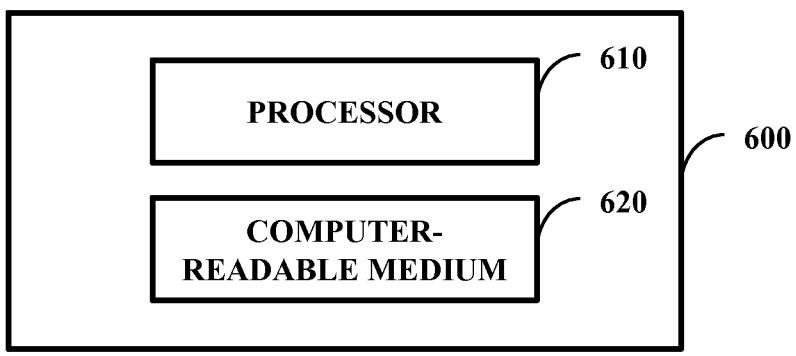
FIG. 6 illustrates one embodiment of a system comprising a processor and a computer-readable medium.

FIG. 6 illustrates one embodiment of a system 600 comprising a processor 610 and a computer-readable medium 620 (e.g., non-transitory computer-readable medium). In one embodiment, the computer-readable medium 620 is communicatively coupled to the processor 610 and stores a command set executable by the processor 610 to facilitate operation of at least one component disclosed herein (e.g., the determination component 410 of FIG. 4 and/or the compensation component 420 of FIG. 4). In one embodiment, at least one component disclosed herein (e.g., the identification component 510 of FIG. 5 and/or the causation component 520 of FIG. 5) can be implemented, at least in part, by way of non-software, such as implemented as hardware by way of the system 600. The processor 610 and/or the computer-readable medium 620 can be used by systems disclosed herein. In one example, when the input switch 310 of FIG. 3 moves and the analog-to-digital converter 210 of FIG. 3 obtains a voltage represented as a number, the number can be retained by the computer-readable medium 620. In one embodiment, the computer-readable medium 620 is configured to store processor-executable instructions that when executed by the processor 610 cause the processor 610 to perform a method disclosed herein (e.g., the method 700 and 800 addressed below).

Figure 7:
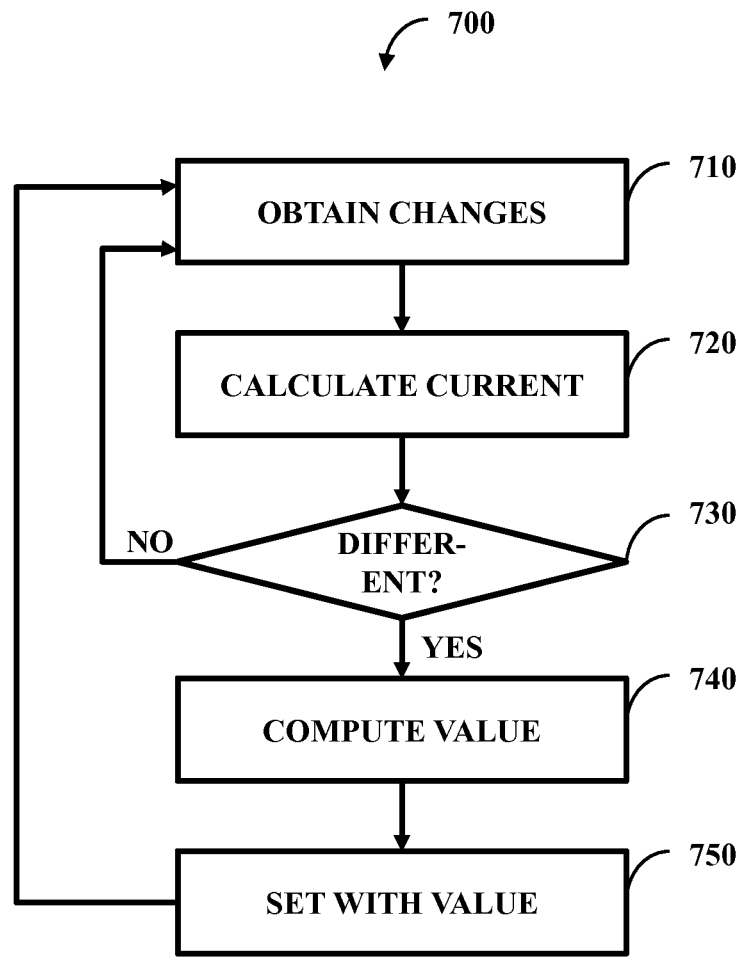
FIG. 7 illustrates one embodiment of a method comprising five actions.

FIG. 7 illustrates one embodiment of a method 700 comprising five actions 710-750. At 710, voltage change information can be obtained. This can include obtaining a first voltage change from across the first measurement resistor 130 of FIG. 1 that is associated with the first transistor 110 of FIG. 1 as well as obtaining a second voltage change from across the second measurement resistor 140 of FIG. 1 that is associated with the second transistor 120 of FIG. 1. Obtaining the first voltage change and second voltage change can comprise obtaining change information that numerically describes the first and second voltage change.

At 720, calculating a current through the first measurement resistor 130 of FIG. 1 can occur by use of the first voltage change. Also at 720 calculating a current through the second measurement resistor 140 of FIG. 1 can occur by use of the second voltage change. While the obtaining and calculating of 710 and 720 respectively are illustrated as occurring in separate actions, these can occur in one action. When occurring as separate actions, the actions may or may not occur concurrently.

At 730, determining if a difference that is undesired exists between the current through the first measurement resistor and the current through the second measurement resistor takes place. If the difference is desired, then the method 700 can function as if there is no difference and the method can return to 710 to obtain changes. If the difference is undesired, then the method 700 can function as if there is a difference and continue.

At 740, a value for compensation resistor 150 of FIG. 1 can be computed. This computation can occur when it is determined at 730 that the difference does exist. The value can be based, at least in part, on the difference between the current through the first measurement resistor 130 of FIG. 1 and the current through the second measurement resistor 140 of FIG. 1.

At 750, the compensation resistor 150 of FIG. 1 can be set to implement with the value. This implementation can be such that the current of the first transistor 110 of FIG. 1 and the current of the second transistor 120 of FIG. 1 match. In one embodiment, the method 700 can return to obtaining change information at 710 once the value is set. This can be to verify that the value is accurately compensating such that the transistors match. If accurate compensation is not occurring, then the method 700 can function again to change the value.

The compensation can be initially accurate, but as time goes on the transistors can physically change such that the uncompensated difference changes and therefore the value no longer performs adequate compensation. This can be identified through actions 710 and 720. At 730 determining if the current through the first measurement resistor 130 of FIG. 1 does not match the current through the second measurement resistor 140 of FIG. 1 after the discrete compensation resistor is set at 750 occurs. If the current through the first measurement resistor 130 of FIG. 1 does not match the current through the second measurement resistor 140 of FIG. 1, then computing a second value (e.g., that is different from the value previously set) for the compensation resistor 150 of FIG. 1 can occur. The compensation resistor 150 of FIG. 1 can be set to implement with the second value such that the current of the first transistor 110 of FIG. 1 and the current of the second transistor 120 of FIG. 1 match.

The method 700 can be performed by a circuit management apparatus. One example of the circuit management apparatus comprises the analog-to-digital converter 210 of FIG. 2 and the controller 220 of FIG. 2. In this example, the analog-to-digital converter 210 of FIG. 2 obtains the change information through measurement and transfers the information to the controller 220 of FIG. 2 and the controller 220 of FIG. 2 performs the other actions. In one example, circuit management apparatus comprises the controller 220 of FIG. 2. The controller 220 of FIG. 2 can obtain the change information through collection of the change information from a measurement source (e.g., the analog-to-digital converter 210 of FIG. 2).

Figure 8:
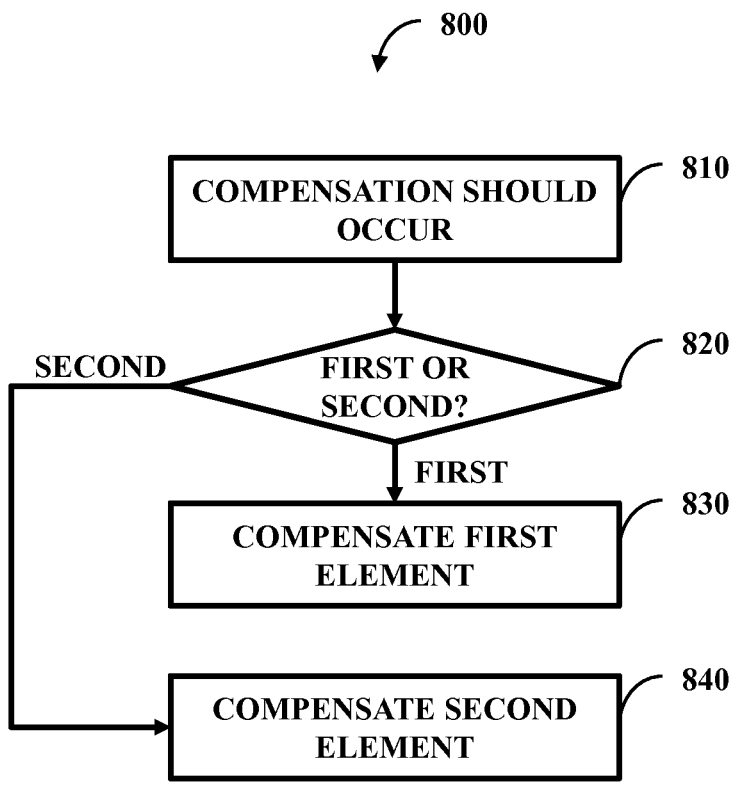
FIG. 8 illustrates one embodiment of a method comprising four actions.

FIG. 8 illustrates one embodiment of a method 800 comprising four actions 810-840. The method 800 can occur with a first and second electronic element that should match and a first and second compensation resistor that are associated with their respectively named element. At 810 an identification can be made that compensation should occur and at 820 a determination can be made on if compensation should take place on the first transistor 110 of FIG. 1 or the second transistor 120 of FIG. 1. In one example, this determination can take place by identifying a higher current between the first and second electronic element. The element with the higher current can have its current adjusted through increased resistance at 830 or 840. Compensation can occur by modifying the value of both compensation resistors (e.g., move one value up and another down).

While the methods disclosed herein are shown and described as a series of blocks, it is to be appreciated by one of ordinary skill in the art that the methods are not restricted by the order of the blocks, as some blocks can take place in different orders. Similarly, a block can operate concurrently with at least one other block. Moreover, designations of 'first' and 'second' are intended merely for identification purposes and not intended to provide any indication of timed order of function, physical location, superiority, importance, etc.

What is claimed is:

1. A system, comprising:
   a determination component configured to make a determination that an output of a first discrete electronic element does not match an output of a second discrete electronic element, wherein the first discrete electronic element and the second discrete electronic element are two different parts of a circuit and do not share a same substrate; and
   a compensation component configured to perform a compensation upon the circuit such that the output of the first discrete electronic element and the output of the second discrete electronic element match,
   wherein the determination component, the compensation component, or a combination thereof is implemented, at least in part, by way of non-software.

2. The system of claim 1,
   wherein the output of the first discrete electronic element is a current of the first discrete electronic element, and
   wherein the output of the second discrete electronic element is a current of the second discrete electronic element.

3. The system of claim 1,
   wherein the output of the first discrete electronic element is a voltage of the first discrete electronic element, and
   wherein the output of the second discrete electronic element is a voltage of the second discrete electronic element.

4. The system of claim 1, wherein the compensation component performs the compensation through adjustment of a bias of at least one of the first discrete electronic element or the second discrete electronic element.

5. The system of claim 1, wherein the compensation component performs the compensation through adjustment of a value of a variable resistor associated with the first discrete electronic element.

6. The system of claim 5,
   wherein the compensation component is configured to select the value of the variable resistor based, at least in part, on the output of the first discrete electronic element and the output of the second discrete electronic element, and
   wherein the variable resistor modifies at least the output of the first discrete electronic element.

7. The system of claim 6,
   wherein the compensation component compares the output of the first discrete electronic element against the output of the second discrete electronic element to create a comparison result,
   wherein the compensation component determines whether there is a difference between output of the first discrete electronic element and the output of the second discrete electronic element through use of the comparison result, and
   wherein the compensation component selects the value when there is a difference.

8. The system of claim 7,
   wherein the compensation component determines whether the difference is desired or is not desired, and
   wherein the compensation component selects the value of the variable resistor when the difference is not desired.

9. The system of claim 8, wherein the difference is not desired when the difference meets a predetermined threshold.

10. The system of claim 8,
    wherein when the difference is a non-constant difference then the difference is desired, and wherein when the difference is a constant difference then the difference is not desired.

11. The system of claim 1, further comprising:
an identification component configured to identify a situation in which a mismatch of the output of the first discrete electronic element and the output of the second discrete electronic element is appropriate; and
a causation component configured to prevent the compensation component from performing the compensation when the situation is identified.

12. The system of claim 1, wherein the determination component and the compensation component operate continuously.

13. A method performed by a circuit management apparatus, the method comprising:
obtaining a first voltage change from across a first measurement resistor, wherein the first measurement resistor is associated with a first transistor;
calculating a current through the first measurement resistor by use of the first voltage change;
obtaining a second voltage change from across a second measurement resistor, wherein the second measurement resistor is associated with a second transistor;
calculating a current through the second measurement resistor by use of the second voltage change;
determining whether a difference that is undesired exists between the current through the first measurement resistor and the current through the second measurement resistor;
computing a value for a discrete compensation resistor when it is determined that the difference does exist, wherein the value is based, at least in part, on the difference between the current through the first measurement resistor and the current through the second measurement resistor; and
setting the discrete compensation resistor to implement with the value such that the current of the first transistor and the current of the second transistor match, wherein the discrete compensation resistor is associated with the second transistor.

14. The method of claim 13, comprising:
determining whether the current through the first measurement resistor does not match the current through the second measurement resistor after the discrete compensation resistor is set;
computing a second value, that is different from the value previously computed, for the discrete compensation resistor if the current through the first measurement resistor does not match the current through the second measurement resistor; and
setting the discrete compensation resistor to implement with the second value such that the current of the first transistor and the current of the second transistor match.

15. The method of claim 13, wherein the first transistor is a first bipolar junction transistor and where the second transistor is a second bipolar junction transistor.

16. The method of claim 13, wherein the first transistor is a first metal-oxide field-effect transistor and where the second transistor is a second metal-oxide field-effect transistor.

17. A system, comprising:
a differential pair comprising:
a first discrete transistor; and
a second discrete transistor,
wherein a current of the first discrete transistor does not match with a current of the second discrete transistor;
a first discrete measurement hardware component physically coupled to the first discrete transistor to produce an information set of the current of the first discrete transistor;
a second discrete measurement hardware component physically coupled to the second discrete transistor to produce an information set of the current of the second discrete transistor; and
a discrete compensation resistor physically coupled to the second discrete transistor and to perform a modification to the current of the second discrete transistor thereby producing a modified current of the second discrete transistor;
wherein the modification is performed based, at least in part, on the information set of the current of the first discrete transistor and the information set of the current of the second discrete transistor and
wherein the current of the first discrete transistor and the modified current of the second transistor are matched.

18. The system of claim 17, further comprising:
an analog-to-digital converter that identifies the information set of the current of the first discrete transistor and identifies the information set of the current of the second discrete transistor; and
a controller that makes a determination of a value of the discrete compensation resistor through use of the information set of the current of the first discrete transistor and the information set of the current of the second discrete transistor, and sets the value of the discrete compensation resistor in accordance with the determination.

19. The system of claim 18, wherein the first discrete measurement hardware component is a first discrete measurement resistor and wherein the second discrete measurement hardware component is a second discrete measurement resistor, the system further comprising:
an input switch that moves among:
a first position aligned with an end of the first discrete measurement resistor,
a second position aligned with another end opposite to the end of the first discrete measurement resistor,
a third position aligned with an end of the second discrete measurement resistor, and
a fourth position aligned with another end opposite to the end of the second discrete measurement resistor,
wherein the analog-to-digital converter obtains a voltage when the input switch is at the first position,
wherein the analog-to-digital converter obtains a voltage when the input switch is at the second position,
wherein the analog-to-digital converter obtains a voltage when the input switch is at the third position,
wherein the analog-to-digital converter obtains a voltage when the input switch is at the fourth position,
wherein the analog-to-digital converter measures the information set of the current of the first discrete transistor through a subtraction between the voltage when the input switch is at the first position and the voltage when the input switch is at the second position, and
wherein the analog-to-digital converter measures the information set of the current of the second discrete transistor through a subtraction between the voltage when the input switch is at the third position and the voltage when the input switch is at the fourth position.

20. The system of claim 19, wherein, after setting the value of the discrete compensation resistor, the analog-to-digital converter, and the input switch, the controller continues to perform their functionalities, respective.

* * * * *